US011242360B2

(12) United States Patent
Rölle et al.

(10) Patent No.: US 11,242,360 B2
(45) Date of Patent: Feb. 8, 2022

(54) PROCESS FOR THE MANUFACTURING OF TRIARYL-ORGANO BORATES

(71) Applicant: Covestro Deutschland AG, Leverkusen (DE)

(72) Inventors: Thomas Rölle, Leverkusen (DE); Ganugapati Satyanarayana, Bangalore (IN); Sumana Roychowdhury, Bangalore (IN); Ravindra Mahadev Patil, Maharashtra (IN); Anup Krishnnan Appukuttan Pillai, Kerala (IN)

(73) Assignee: COVESTRO DEUTSCHLAND AG, Leverkusen (DE)

( * ) Notice: Subject to any disclaimer, the term of this patent is extended or adjusted under 35 U.S.C. 154(b) by 40 days.

(21) Appl. No.: 16/348,333

(22) PCT Filed: Nov. 7, 2017

(86) PCT No.: PCT/EP2017/078416
§ 371 (c)(1),
(2) Date: May 8, 2019

(87) PCT Pub. No.: WO2018/099698
PCT Pub. Date: Jun. 7, 2018

(65) Prior Publication Data
US 2020/0062786 A1 Feb. 27, 2020

(30) Foreign Application Priority Data

Nov. 9, 2016 (EP) .................................... 16197986
Aug. 8, 2017 (EP) .................................... 17185207

(51) Int. Cl.
C07F 5/02 (2006.01)
G03F 7/00 (2006.01)
G03F 7/029 (2006.01)

(52) U.S. Cl.
CPC ............. C07F 5/027 (2013.01); G03F 7/001 (2013.01); G03F 7/029 (2013.01)

(58) Field of Classification Search
CPC .................................. C07F 5/027; C07B 49/00
See application file for complete search history.

(56) References Cited

U.S. PATENT DOCUMENTS

| | | | |
|---|---|---|---|
| 2,857,310 A | 10/1958 | Heininger | |
| 3,125,555 A | 3/1964 | Paré et al. | |
| 4,076,756 A | 2/1978 | Nazarenko et al. | |
| 4,772,541 A | 9/1988 | Gottschalk et al. | |
| 4,954,635 A | 9/1990 | Rosario-Jansen et al. | |
| 4,970,217 A | 11/1990 | Prücher et al. | |
| 5,151,520 A | 9/1992 | Gottschalk et al. | |
| 5,194,472 A | 3/1993 | Wilson et al. | |
| 5,565,290 A | 10/1996 | Itakura et al. | |
| 6,002,044 A * | 12/1999 | Yamada | C07C 211/63 564/8 |
| 6,096,794 A | 8/2000 | Cunningham et al. | |
| 6,140,537 A | 10/2000 | Katoh et al. | |
| 6,210,863 B1 | 4/2001 | Cunningham et al. | |
| 9,146,456 B2 | 9/2015 | Berneth et al. | |
| 9,754,084 B2 | 9/2017 | Rölle et al. | |
| 9,804,490 B2 | 10/2017 | Rölle et al. | |
| 10,001,703 B2 | 6/2018 | Berneth et al. | |

FOREIGN PATENT DOCUMENTS

| | | | |
|---|---|---|---|
| CN | 1158854 A | 9/1997 | |
| CN | 1223263 A | 7/1999 | |
| CN | 105814487 A | 7/2016 | |
| CN | 106030711 A | 10/2016 | |
| DE | 3723797 A1 | 1/1989 | |
| DE | 19850139 A1 | 5/1999 | |
| EP | 0223587 A1 | 5/1987 | |
| EP | 0922708 A2 * | 6/1999 | ........... C07C 211/63 |
| GB | 1530180 A | 10/1978 | |
| GB | 2307474 A | 5/1997 | |
| JP | 52-062252 A | 5/1977 | |
| JP | 62-143044 A | 6/1987 | |
| JP | 11-029578 A | 2/1999 | |
| JP | 11-222489 A | 8/1999 | |
| JP | 200123381 A | 1/2001 | |
| JP | 2002226486 A | 8/2002 | |
| JP | 2012211938 A | 11/2012 | |
| SK | 278487 B6 | 7/1997 | |
| TW | 494123 B | 7/2002 | |
| WO | 98/34938 A1 | 8/1998 | |
| WO | WO-2000030444 A1 | 6/2000 | |
| WO | WO-2012062655 A2 | 5/2012 | |
| WO | WO-2014053408 A1 | 4/2014 | |
| WO | WO-2015055576 A1 | 4/2015 | |

(Continued)

OTHER PUBLICATIONS

Ritter ("Calcium's Awakening", Synthesis, vol. 89, Issue 10, Mar. 2011, pp. 1-5).*
International Search Report for PCT/EP2017/078412 dated Mar. 20, 2018.
International Search Report for PCT/EP2017/078415 dated Jan. 3, 2018.
International Search Report for PCT/EP2017/078416 dated Jan. 4, 2018.
Written Opinion of the International Searching Authority for PCT/EP2017/078412 dated Mar. 20, 2018.
Written Opinion of the International Searching Authority for PCT/EP2017/078415 dated Jan. 3, 2018.

(Continued)

Primary Examiner — Rosalynd A Keys

(57) ABSTRACT

The invention relates to a process for the preparation of triaryl-organo borates from boronic ester and the use of these substances in photo initiator systems, photopolymer compositions comprising such photo initiator systems, a holographic medium comprising said photopolymer composition and the respective hologram.

7 Claims, 1 Drawing Sheet

(56) References Cited

FOREIGN PATENT DOCUMENTS

WO     WO-2015091427 A1    6/2015
WO     WO-2015187766 A1    12/2015

OTHER PUBLICATIONS

Written Opinion of the International Searching Authority for PCT/EP2017/078416 dated Jan. 4, 2018.
U.S. Appl. No. 16/348,262, filed May 9, 2019.
U.S. Appl. No. 16/348,309, filed May 9, 2019.
International Preliminary Reporton Patentability received for PCT Patent Application No. PCT/EP2017/078416, dated May 23, 2019, 7 pages.
Fujita et al., "Synthesis and structural characterization of a new class of organoborato ligands containing imidazolyl functional groups [MeB(ImN-Me)2(X)]-", J.Chem. Soc., Dalton Trans., 2000, pp. 1255-1260.

\* cited by examiner

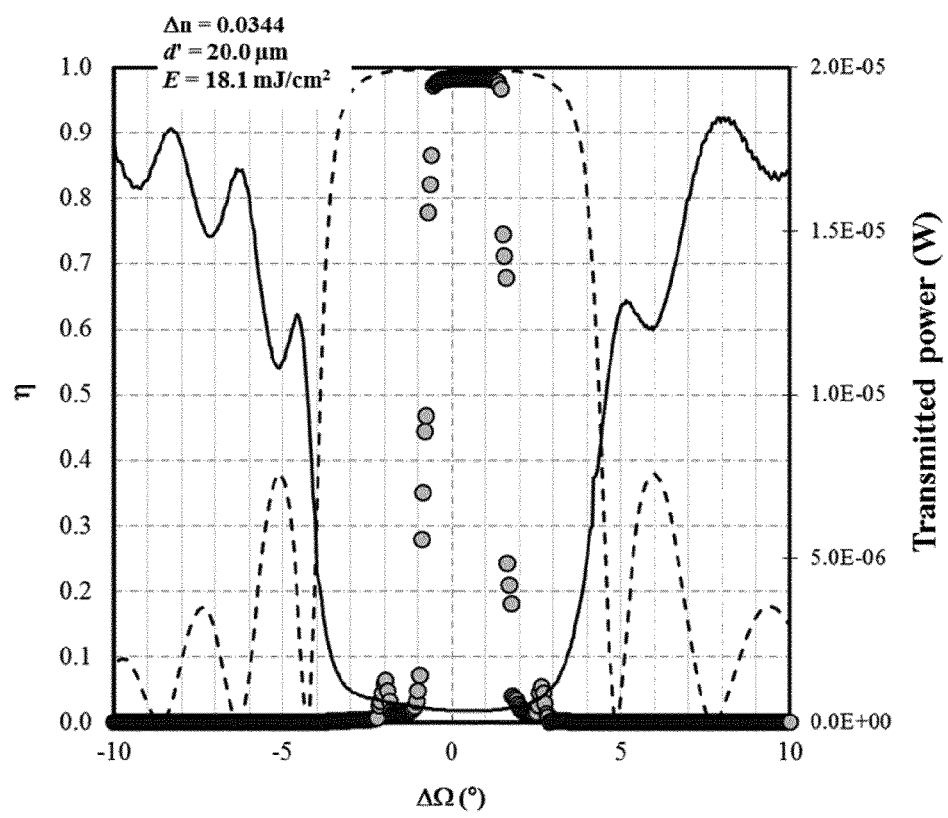

PROCESS FOR THE MANUFACTURING OF TRIARYL-ORGANO BORATES

CROSS-REFERENCE TO RELATED APPLICATIONS

This application is a national stage application (under 35 U.S.C. § 371) of PCT/EP2017/078416, filed Nov. 7, 2017, which claims benefit of European Application Nos. 16197986.9, filed Nov. 9, 2016, and 16197986.9, filed Aug. 8, 2017, all of which are incorporated herein by reference in their entirety.

The invention relates to a process for the preparation of triaryl-organo borates from boronic ester and the use of these substances in photo initiator systems, photopolymer compositions comprising such photo initiator systems, a holographic medium comprising said photopolymer composition and the respective hologram.

Triaryl-organo borates can form photoinitiators that trigger a radical photopolymerization of suitable monomers together with suitable sensitizers such as cationic, anionic or neutral dyes by actinic radiation. The preparation of triaryl-organo borates is described widely and selected tetra alkyl ammonium triaryl-organo borates are commercially available.

The manufacturing of tetra alkyl ammonium triaryl-organo borates in the past can be realized by starting from the expensive, limited available, and highly corrosive dibromoborane-dimethylsufide, cf. JP 2002226486 A. Moreover, this route leads to an intrinsic amount of highly undesired tetra aryl borate. It was therefore the objective to develop a robust, scalable method for production of the triaryl-organo borates salts avoiding the use of the dibromoborane-dimethylsufide.

U.S. Pat. No. 4,076,756 A describes the synthesis of a tetra alkyl ammonium salt of a triaryl monoalkyl boron compound by reaction of an alkali metal, e.g. sodium, with an organohalide, e.g. chlorobenzene, and an orthoborate ester, e.g. triisopropyl borate. This method does not provide any control of the chemo selectivity of the reaction in cases where there are multiple halide substituents on the aromatic ring, e.g. 4-bromo 2-chlorotoluene. Also, use of sodium dispersion in larger scales possesses a potential hazard due to its pyrophoricity.

U.S. Pat. No. 5,151,520 A discloses the synthesis of a tetra alkyl ammonium salt of a triaryl monoalkyl boron compound to be used as a photoinitiator, by reacting a commercially obtained triphenyl borane with alkyl lithium in an inert atmosphere followed by isolation of the lithium salt and further carrying out an ion-exchange reaction between this lithium salt and a tetra alkyl ammonium halide. The drawbacks of this method include difficulty in isolation of the air-sensitive lithium salt intermediate which may lead to lowered reaction yields. Also since a commercially available triphenyl borane has been used this precludes the possibility of having various other useful substituents on the aromatic rings. U.S. Pat. No. 5,151,520 A further describes a second method of synthesis of the final product by a reaction between an alkene and a solution of dibromoborane methylsulfide complex (DBBS) under inert conditions followed by an ion exchange reaction with tetra alkyl ammonium salts. Due to the presence of tribromo methylsulfide this route will always generate some tetraaryl borate as by-product and a subsequent purification step will be thus necessary.

The problem addressed by the present invention was therefore to provide a process for the manufacturing of triaryl-organo borates in high purity following a synthetic route that does not allow the formation of the undesired tetra aryl borate and that offers a more beneficial and improved space-time yield that allows a more economical overall process including improved downstream process or work-up procedure.

This problem is solved by a process for the production of triaryl-organo borates of the formula $1/m\ A^{m+}[R^1BR_3^3]^-$ (IX) obtainable or obtained by reacting a boronic ester of formula $B(OR^2)_3$ (I) with an organolithium- or Grignard-reagent of formula $R^1$-E (II) in a solvent or solvent mixture S1, adding a previously formed organometallic reagent of the formula $R^3$-M-X (V) in a solvent or solvent mixture S2, further adding a salt of the formula $1/m\ A^{m+}\ Y^-$ (VIII) and isolating the precipitated triaryl-alkyl borate product of formula $1/m\ A^{m+}[R^1BR_3^3]^-$ (IX)

in which

A stands for a substituted organic cation with the charge m on the basis of nitrogen, phosphorus, oxygen, sulfur and/or iodine, B stands for boron E stands for lithium or magnesium-monohalide, M stands for a metal selected from magnesium, calcium, aluminum, tin, zinc or cadmium, X stands for chlorine, bromine or iodine, preferably chlorine or bromine, Y stands for halide, alkoxyde, or sulfide, preferably for halide, $R^1$ stands for a $C_1$- to $C_{22}$-alkyl-, $C_3$- to $C_{22}$-alkenyl-, $C_3$- to $C_{22}$-alkynyl-, $C_5$- to $C_7$-cycloalkyl- or $C_7$- to $C_{15}$-aralkyl-residue, which can be optionally substituted by oxygen or nitrogen or halogen, $R^2$ stands for an optionally branched $C_1$- to $C_{22}$-alkyl-residue or an optionally alkyl-substituted $C_3$- to $C_7$-cycloalkyl-residue or an optionally aryl- or hetaryl substituted $C_2$- to $C_{22}$-alkyl-residue or $R^2$ may form a 2-8-membered bicyclic ring optionally substituted by alkyl residues and/or by oxygen atoms or $R^2$ may form 4-14-membered tricyclic ring an optionally substituted by alkyl residues and/or by oxygen atoms, $R^3$ stands for a $C_6$- to $C_{14}$-aryl residue optionally substituted by at least one residue selected from halogen, $C_1$- to $C_4$-alkyl, trifluoromethyl, $C_1$- to $C_4$-alkoxy, trifluoromethoxy, phenyl and/or phenoxy, m stands for 1, 2 or 3, preferably for 1 or 2, most preferably for 1, S1 and S2 independently from one another stand for an aprotic organic solvent or a mixture of aprotic organic solvents, In another embodiment of the inventive process, the production of triaryl-organo borates of the formula $1/m\ A^{m+}[R^1BR_3^3]^-$ (IX) comprises the steps of i) reacting boronic ester of formula $B\text{—}(O\text{—}R^2)_3$ (I) in a solvent or solvent mixture S1 at a temperature or temperature range T1 with an organolithium- or Grignard-reagent of formula $R^1$-E (II) to yield the salt of formula $[R^1B(OR^2)_3]^-E^+$ (III), ii) reacting an organic halogen compound of formula $R^3$-X (IV) in a solvent or solvent mixture S2 at a temperature or temperature range T2 with a metal M to yield an organometallic reagent of formula $R^3$-M-X (V), iii) reacting the compounds (III) and (V) in a combined solvent or solvent mixture S1 and S2 at a temperature or temperature range T3 to yield the salts of formula $[R^1BR_3^3]^-E^+$ (VI) and of formula $R^2O$-M-X (VII), iv) adding the salt of formula $1/m\ A^{m+}Y^-$ (VIII) and water and v) isolating the precipitated product of formula $1/m\ A^{m+}[R^1BR_3^3]^-$ (IX), whereby T1 stands for a temperature of −110° C. to −50° C., preferably −100° C. to −60° C., most preferably −90° C. to −70° C., T2 stands for a temperature of −20° C. to 100° C., preferably 0° C. to 80° C., most preferably 25° C. to 70° C. and T3 stands for a temperature of 0° C. to 100° C., preferably 10° C. to 80° C., most preferably 25° C. to 70° C.

The inventive process is further described by the following reaction scheme.

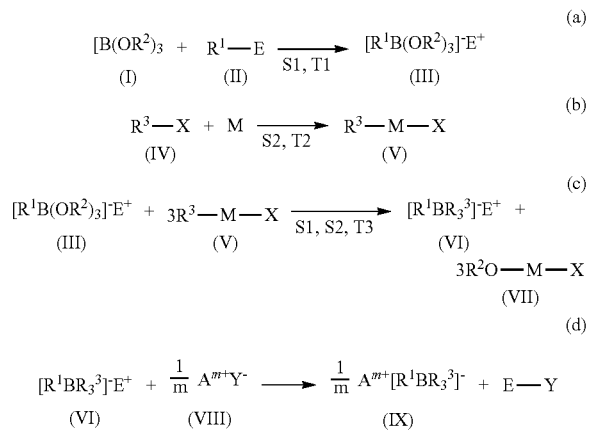

Preferably $R^1$ stands for an $C_2$- to $C_{18}$-alkyl-, $C_3$- to $C_{18}$-alkenyl-, $C_3$- to $C_{18}$-alkynyl-, $C_5$- to $C_6$-cycloalkyl- or $C_7$- to $C_{13}$-aralkyl residue optionally substituted by oxygen and/or halogen, and most preferably $R^1$ stands for an $C_4$- to $C_{16}$-alkyl-, $C_3$- to $C_{16}$-alkenyl-, $C_3$- to $C_{16}$-alkynyl-, cyclohexyl- or $C_7$- to $C_{13}$-aralkyl residue optionally substituted by oxygen and/or halogen.

Preferably $R^2$ stands for an eventually branched $C_2$- to $C_{18}$-alkyl-residue or $R^2$ forms a 2-6-membered bicyclic ring optionally substituted by alkyl residues and/or by oxygen atoms or $R^2$ may form a 4-10-membered tricyclic ring optionally substituted by alkyl residues and/or by oxygen atoms.

Preferably $R^3$ stands for a $C_6$- to $C_{10}$-aryl residue that may be optionally substituted by at least one of the residues selected from halogen, $C_1$- to $C_4$-alkyl, trifluormethyl, $C_1$- to $C_4$-alkoxy, trifluormethoxy, phenyl and/or phenoxy and especially preferred $R^3$ stands for a $C_6$-aryl residue that may be optionally substituted by at least one of the residues selected from halogen, $C_1$- to $C_4$-alkyl, trifluormethyl, $C_1$- to $C_4$-alkoxy, trifluormethoxy, phenyl and/or phenoxy and most preferred $R^3$ stands for a $C_6$-aryl residue substituted by at least two of the residues selected from halogen, $C_1$- to $C_4$-alkyl, trifluormethyl, $C_1$- to $C_4$-alkoxy and/or trifluormethoxy.

A substituted organic cation A with the charge m on the basis of nitrogen may be for example ammonium, pyridinium, pyridazinium, pyrimidinium, pyrazinium, imidazolium, 1H-pyrazolium, 3H-pyrazolium, 4H-pyrazolium, 1-pyrazolinium, 2-pyrazolinium, 3-pyrazolinium, imidazolinium, thiazolium, 1,2,4-triazolium, 1,2,3-triazolium, pyrrolidinium, chino-linium, that may be further substituted by optionally one or more side chains containing functional groups like ethers, esters, amides and/or carbamates and that may also have oligomeric or polymeric or bridging character. Preferred organic cations A with the charge m on the basis of nitrogen are for example ammonium, pyridinium, pyridazinium, pyrimidinium, pyrazinium, imidazolium, pyrrolidinium, that may be further substituted by optionally one or more side chains containing functional groups like ethers, esters, amides and/or carbamates and that may also have oligomeric or polymeric or bridging character. Especially preferred organic cations A with the charge m on the basis of nitrogen are for example ammonium, pyridinium and imidazolium, that may be further substituted by optionally one or more side chains containing functional groups like ethers, esters, amides and/or carbamates and that may also have oligomeric or polymeric or bridging character. In addition, polymeric cations may be comprised as well by the above description.

A substituted organic cation A with the charge m on the basis of phosphorus is a phosphorus(IV)-compounds with coordination number 4, like for example substituted tetraalkyl-phosphonium-, trialkyl-aryl-phosphonium-, dialkyl-diaryl-phosphonium-, alkyl-triarylphosphonium- or tetraarylphosphonium-salts, that may be further substituted by optionally one or more side chains containing functional groups like ethers, esters, carbonyls, amides and/or carbamates and that may also have oligomeric or polymeric or bridging character. Aromatic residues may in addition be substituted with halogen, nitro-, cyano-, trifluormethyl-, ester-, and/or ether-residues. The alkyl- and aryl-residues may be connected by carbon- or mono- and/or poly-ether chains forming mono- or polycyclic structures. Preferred substituted organic cations B with the charge m on the basis of phosphorus are for example substituted tetraalkyl-phosphonium-, trialkyl-aryl-phosphonium-, dialkyl-diaryl-phosphonium-, alkyl-triaryl-phosphonium-, or tetraaryl-phosphonium-salts, that may be further substituted by optionally one or more side chains containing functional groups like carbonyls, amides and/or carbamates and that may also have oligomeric or polymeric or bridging character. Aromatic residues may in addition be substituted with halogen, ester-, and/or ether-residues. The alkyl- and aryl-residues may be connected by carbon- or mono- and/or poly-ether chains forming mono- or polycyclic structures. Especially preferred substituted organic cations A with the charge m on the basis of phosphorus are for example substituted tetraalkyl-phosphonium-, trialkyl-aryl-phosphonium-, alkyl-triaryl-phosphonium-, or tetraarylphosphonium-salts, that may be further substituted by optionally one or more side chains containing functional groups like carbonyls, amides and/or carbamates and that may also have oligomeric or polymeric or bridging character. Aromatic residues may in addition be substituted with halogens. The alkyl- and aryl-residues may be connected by carbon- or mono- and/or poly-ether chains forming mono- or polycyclic structures. In addition, polymeric cations may be comprised as well by the above description.

A substituted organic cation A with the charge m on the basis of oxygen is for example a substituted pyrylium, also comprising annulated exhibits like in benzopyrylium, flavylium or naphthoxanthenium. A preferred substituted organic cation A with the charge m on the basis of oxygen is for example a substituted pyrylium, also comprising annulated exhibits like in benzopyrylium or flavylium. In addition, polymeric cations may be comprised as well by the above description.

A substituted organic cation A with the charge m on the basis of sulfur is for example an onium-compound carrying identical or different optionally substituted $C_1$- to $C_{22}$-alkyl-, $C_6$- to $C_{14}$-aryl-, $C_7$- to $C_{15}$-arylalkyl- or $C_5$- to $C_7$-cycloalkyl residues and/or oligomeric or polymeric repeating units connecting to onium ions with the total charge m of $1 \leq n \leq 3$. A preferred substituted organic cation A with the charge m on the basis of sulfur is for example an onium-compound carrying identical or different optionally substituted $C_1$- to $C_{14}$-alkyl-, $C_6$- to $C_{10}$-aryl-, $C_7$- to $C_{12}$-arylalkyl- or $C_5$- to $C_6$-cycloalkyl residues and/or oligomeric or polymeric repeating units connecting to onium ions with the total charge m of $1 \leq n \leq 3$. An especially preferred substituted organic cation A with the charge m on the basis of sulfur is for example an onium-compound carrying identical or different optionally substituted $C_1$- to $C_{12}$-alkyl-, $C_6$- to $C_{10}$-aryl-, $C_7$- to $C_{12}$-arylalkyl- or $C_5$- to $C_6$-cycloalkyl residues and/or oligomeric or polymeric repeating units connecting to onium ions with the total charge m of $1 \leq n \leq 3$. In addition, polymeric cations may be comprised as well by the above description.

A substituted organic cation A with the charge m on the basis of iodine is for example an onium-compound carrying identical or different optionally substituted $C_1$- to $C_{22}$-alkyl-, $C_6$- to $C_{14}$-aryl-, $C_7$- to $C_{15}$-arylalkyl- or $C_5$- to $C_7$-cycloalkyl residues and/or oligomeric or polymeric repeating units connecting to onium ions with the total charge m of $1 \leq n \leq 3$. A preferred substituted organic cation A with the charge o on the basis of iodine is for example an onium-compound carrying identical or different optionally substituted $C_1$- to $C_{14}$-alkyl-, $C_6$- to $C_{10}$-aryl-, $C_7$- to $C_{12}$-arylalkyl- or $C_5$- to $C_6$-cycloalkyl residues and/or oligomeric or polymeric repeating units connecting to onium ions with the total charge m of $1 \leq n \leq 3$. An especially preferred substituted organic cation A with the charge m on the basis of iodine is for example an onium-compound carrying identical or different optionally substituted $C_1$- to $C_{12}$-alkyl-, $C_6$- to $C_{10}$-aryl-, $C_7$- to $C_{12}$-arylalkyl- or $C_5$- to $C_6$-cycloalkyl residues and/or oligomeric or polymeric repeating units connecting to onium ions with the total charge m of $1 \leq n \leq 3$. In addition, polymeric cations may be comprised as well by the above description.

An aprotic organic solvent or a mixture of aprotic organic solvents S1 or—independently from one another—S2 can only be deprotonated with strong base (Reichardt, C., Solvents and Solvent Effects in Organic Chemistry, 3. Ed.; Wiley-VCH: Weinheim, (2003)). Examples of aprotic organic solvents are alkanes, alkenes, benzene and aromatics with aliphatic and/or aromatic substituents, carboxylic acid esters, ethers or mixtures thereof. Preferred aprotic organic solvents are alkanes, aromatic compounds with aliphatic and/or aromatic substituents, ether or mixtures thereof. Aromatic hydrocarbons such as solvent naphtha, toluene or xylene or ethers such as tetrahydrofuran, methyltetrahydrofuran, diethyl ether or dimethoxyethane may be used as aprotic organic solvents or mixtures of aprotic organic solvents S1 or S2. The solvent should be substantially anhydrous.

In an embodiment of the invention, M stands for magnesium, calcium or aluminum, and preferably M stands for magnesium.

In this invention $C_1$-$C_{22}$-alkyl comprises for example and is not limited to methyl, ethyl, n-propyl, iso-propyl, n-butyl, sec.-butyl, tert.-butyl, n-pentyl, 1-methylbutyl, 2-methylbutyl, 3-methylbutyl, neo-pentyl, 1-ethylpropyl, 1,1-dimethylpropyl, 1,2-dimethylpropyl, n-hexyl, 1-methylpentyl, 2-methylpentyl, 3-methylpentyl, 4-methylpentyl, 1,1-dimethylbutyl, 1,2-dimethylbutyl, 1,3-dimethylbutyl, 2,2-dimethylbutyl, 2,3-dimethylbutyl, 3,3-dimethylbutyl, 1-ethylbutyl, 2-ethylbutyl, 1,1,2-trimethylpropyl, 1,2,2-trimethylpropyl, 1-ethyl-1-methylpropyl, 1-ethyl-2-methylpropyl or 1-ethyl-2-methylpropyl, n-heptyl, n-octyl, 2-ethylhexyl, pinacoyl, n-nonyl, n-decyl, n-dodecyl, n-tridecyl, n-tetradecyl, n-hexadecyl, n-octadecyl, n-eicosyl, n-docosyl.

The same applies to the corresponding alkyl group, for example in the alkyl or alkylaryl, alkylphenyl- or alkylcarbonyl-groups.

Alkylene residues in substituted alkyl residues as well as alkenyl residues or alkynyl residues stand for example for the above mentioned alkyl residues corresponding alkylene residue, alkenyl residue or alkinyl residue. Examples are 2-chloroethyl, benzyl, allyl, 2-buten-1-yl, or propargyl.

Cycloalkyl in the context of the invention stands for example for cyclopropyl, cyclobutyl, cyclopentyl, cyclohexyl, cycloheptyl, adamantyl or the isomeric menthylenes.

Aryl stands for a carbocyclic aromatic radical having 6 to 14 skeleton carbon atoms. The same applies to the aromatic part of an arylalkyl radical, also called aralkyl, and aryl constituents of more complex groups such as aryl carbonyl.

Examples of $C_6$ to $C_{14}$-aryl are phenyl, o-, p-, m-tolyl, o-, p-, m-ethylphenyl, naphthyl, phenanthrenyl, anthracenyl, fluorenyl, o-, p-, m-fluorophenyl, o-, p-, m-chlorophenyl, o-, p-, m-methoxyphenyl, o-, p-, m-trifluoromethylphenyl, o-, p-, m-trifluoromethoxyphenyl, o-, m- or p-biphenylyl or o-, p-, m-phenoxyphenyl, 3,4-dimethylphenyl, 3,4-dichloromethyl, 3,4-difluoro-phenyl, 3,4-dimethoxyphenyl, 4-methyl-3-fluorophenyl, 4-methyl-3-chlorophenyl, 3,4,5-trifluorophenyl.

Arylalkyl or aralkyl each independently stand for a linear chain-, cyclic-, branched- or unbranched alkyl radical as defined above, that may be substituted singly, multiple or completely by aryl radicals as defined above. Examples are benzyl, 4-chlorobenzyl, phenethyl, 2-phenyl-1-propyl, 3-phenyl-1-propyl, 1-phenyl-2-propyl, or diphenylmethyl.

Examples of a 2-8 membered bicyclic ring optionally substituted by alkyl residues and/or by oxygen atoms are —CH$_2$—CH$_2$—, —CH$_2$—CH$_2$—CH$_2$—, —CH$_2$—CH$_2$—CH$_2$—CH$_2$—, —CH$_2$—CH$_2$—O—CH$_2$—CH$_2$—, or —CH$_2$—CH(CH$_3$)—.

Examples of 4-14-membered tricyclic ring optionally by alkyl residues and/or by oxygen atoms substituted are:

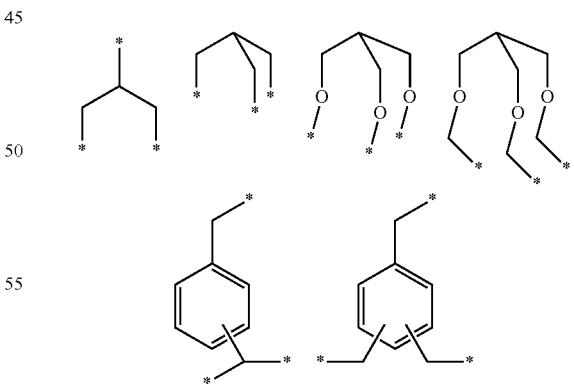

The reaction is generally carried out without applying pressure, i.e. working at least at the autogenous pressure. The reaction is preferably done under inert atmosphere like nitrogen or argon atmosphere.

It is advantageous for the entire duration of the reaction to ensure good mixing of the batch by constant stirring, and by selecting a suitable solvent S1 for the start of the reaction.

It was surprisingly found that when applying organolithium- or Grignard-reagent (II) yielding the salt (III) the organo compound of the reagent (II) seems to block the reaction center of (I) thus suppressing the formation of undesired tetra aryl borates and yielding a purer product (IX).

Step (b) of the reaction is conveniently started by the addition of a maximum of 10% of the total amount of the compound (IV) and the compound (IV) is then added as solution of 10-90% strength, preferably 15-75% strength particularly preferred as 20-50% strength in the solvent S2 for further reaction while the temperature T2 is kept at the levels as described above thus controlling the exothermic reaction. For initiation of the reaction one can also optionally add known compounds as dibromoethane, iodine, or the metal surface M can be activated by ultrasound.

The addition of salt (VIII) to the salts (VI) and (VII) in step (d) surprisingly leads to the precipitation of product (IX) while all by-products remain in the liquid phases. Product IX can thus be isolated in high yields and often in a high degree of purity as a crystalline solid.

A further object of the invention are the triaryl-organo borates of the formula $1/m\ A^{m+}\ [R^1BR_3^3]^-$ (IX) obtainable or obtained according to the inventive process. In an embodiment of the invention, it comprises less than 10.000 ppm of a tetra aryl borate $1/m\ A^{m+}[BR_4^3]^-$, preferably less than 5.000 ppm of a tetra aryl borate $1/m\ A^{m+}[BR_4^3]^-$ most preferably less than 1.000 ppm of a tetra aryl borate $1/m\ A^{m+}[BR_4^3]^-$. The unit ppm refers to parts per million by weight.

Another objective of the invention is the use of the triaryl-organo borates of the formula $1/m\ A^{m+}[R^1BR_3^3]^-$ (IX) in photo initiator systems. Such photo initiator systems can form part of photopolymer composition along with a photopolymerizable component.

A further object of the invention is a photopolymer composition comprising a photopolymerizable component and a photo initiator system comprising triaryl-organo borates of the formula $1/m\ A^{m+}[R^1BR_3^3]^-$ (IX) obtainable or obtained according to the inventive process. In an embodiment of the invention, it comprises 0.1-10.0 weight-% of the borate salt, preferably 0.2-8.0 weight-%, most preferably 0.3-5.0 weight-%. The photo initiator system may further comprises at least one co-initiator selected from borate initiators, trichloromethyl initiators, aryloxide initiators, bisimidazole initiators, ferrocene initiators, aminoalkyl initiators, oxime initiator, thiol initiators, peroxide initiators.

Another object of the invention is a holographic medium comprising such a photopolymer and the hologram such a holographic medium. Such holographic media provide holograms with high index contrasts.

Test Methods

Isocyanate Content (NCO Value)

The isocyanate contents reported were determined according to DIN EN ISO 11909.

HPLC Method 1 (Purity)

HPLC analysis was carried out in HPLC system with diode array detector using C18 column. A mixture of acetonitrile, triethyl amine and glacial acetic acid and water, triethyl amine and acetic acid at various composition were used as mobile phases. Purity is measured as area percentage by integrating all the peaks excluding blank peaks by dividing each peak area in the chromatogram by total area of all the peaks. Tetra butyl ammonium tris(3-chloro-4-methyl-phenyl)hexyl borate elute at a retention time of 14.7 minutes and tetra aryl substituted borate impurity at 12.1 minutes Colour (Haze)

1.00 g of the analyte were dissolved in 3.00 g methyl ethyl ketone and the colour was determined according to DIN EN ISO 14782:1999.

Refractive Index Modulation Δn:

The holographic property Δn of the holographic media was determined by two beam interference in reflection as described in WO2015091427, a representative plot is shown in FIG. 1.

Substances:

Desmodur® N 3900, product of Covestro AG, Leverkusen, DE, Hexandiisocyanat-based polyisocyanate, amount of iminooxa-diazindione at least 30%, NCO content: 23.5%.

Fomrez UL 28, Catalyst, Product of Momentive Performance Chemicals, Wilton, Conn., USA.

Dye 1, (3,7-Bis(diethylamino)-phenoxacin-5-ium bis(2-ethylhexyl)succinate) was prepared as described in WO 2012062655.

Polyol 1 is the polyol 1 of WO2015091427 and prepared as described therein.

Urethane acrylate 1, (Phosphorothioyltris(oxybenzol-4,1-diyl)carbamoyloxyethan-2,1-diyl)trisacrylate, [1072454-85-3]) was prepared as described in WO2015091427.

Urethan acrylate 2, (2-({[3-(Methylsulfanyl)phenyl]carbamoyl}oxy)-ethylprop-2-enoate, [1207339-61-4]) was prepared as described in WO2015091427.

Additive 1, Bis(2,2,3,3,4,4,5,5,6,6,7,7-dodecafluorheptyl)-(2,2,4-trimethylhexan-1,6-diyl)biscarbamat [1799437-41-4] was prepared as described in WO2015091427.

The used solvents and reagents were purchased from specialty chemicals traders. Anhydrous solvents contain <50 ppm water.

Synthesis of Tetrabutyl Ammonium Tris(3-Chloro-4-Methyl-Phenyl)Hexylborate

Example 1

1. Synthesis of Lithium Triisopropyl (Hexyl) Borate (Step a)

67.5 L dry THF was charged into the reactor and (4.125 kg) triisopropyl borate was added and degassed with slow stream of nitrogen gas for 15 min. The reactor was cooled to −78±2° C. and 7.5 kg n-hexyllithium (2.3 M) was transferred slowly into the reactor under stirring at this temperature. This reaction was continued for two hours under stirring at −78±2° C. After this the reaction mass was allowed to gradually reach temperature of 8±2° C.

2. Grignard Reaction (Step b)

60 L dry THF was charged into the reactor and 1.8 kg magnesium along with 60 g of iodine were added. The reactor was heated to 48±2° C. and (15 kg) 4-bromo-2-chlorotoluene along with 30 L dry THF was charged to the dropping funnel. Both the solutions from reactor and dropping funnel were degassed with slow stream of nitrogen gas for 15 min respectively. The degassed solution of 4-bromo-2-chlorotoluene from the dropping funnel was charged slowly in to reactor under stirring. A maximum amount of 4.0 L of the solution of 4-bromo-2-chlorotoluene was added before a temperature increases indicated the start of the organometallic reaction. After completion of addition, the reactor was further heated to 65±2° C. (or reflux temperature of THF) and the reaction mixture is maintained at that temperature for 3 h under stirring. Then, the reaction mixture was gradually cooled to 13±2° C.

Steps a & b were carried out simultaneously but in separate reactors since neither of the intermediates are stable to storage 3. Synthesis of Tetrabutyl Ammonium Tris(3-Chloro-4-Methyl-Phenyl)Hexylborate (Steps c & d)

The solution of step (a) was slowly added to the solution of step (b) at 13±2° C. under constant cooling and stirring. After completion of charging, the reactor temperature was slowly brought to room temperature and stirring was continued for next 4 h (step c). The reaction was then quenched with a solution of 4.8 kg tetrabutyl ammonium bromide in 30 L water at 27±2° C. and stirring continued for additional 30 min. 90 L of ethyl acetate was added into the reaction mass and the aqueous and organic phases were separated. The aqueous phase was discarded and the organic phase was extracted with water thrice (3*90 L). The organic phase was then concentrated to get a slurry. 150 L methanol were added to the slurry and it was heated to reflux temperature (65-70° C.) for 1-2 h and then the hot methanol solution was filtered. The solution was then cooled to 8±2° C. for 10-12 h and filtered to get the recrystallized product. The product was washed with 5-10 L methanol and dried at 60±2° C. in vaccuo until the desired LOD values (<0.1%) was achieved. The product obtained was a white solid with output of 6.3 kg, yield 50% of theory, purity ~95% and APHA 50

Example 2

1. Synthesis of Lithium Triisopropyl (Hexyl) Borate (Step a)

67.5 L dry THF was charged into the reactor and (4.125 kg) triisopropyl borate was added and degassed with slow stream of nitrogen gas for 15 min. The reactor was cooled to −78±2° C. and 7.5 kg n-hexyllithium (2.3 M) was transferred slowly in to the reactor under stirring. This reaction was continued for two hours at 78±2° C. After this the reaction mass was allowed to gradually reach temperature of 8±2° C.

2. Grignard Reaction (Step b)

60 L dry THF was charged into the reactor and 1.8 kg magnesium along with 60 g of iodine added. The reactor was heated to 48±2° C. and (15 kg) 4-bromo-2-chlorotoluene along with 30 L dry THF was charged to the dropping funnel. Both the solutions from reactor and dropping funnel were degassed with slow stream of nitrogen gas for 15 min respectively. The degassed solution of 4-bromo-2-chlorotoluene from the dropping funnel was charged slowly into the reactor under stirring. A maximum amount of 4.0 L of the solution of 4-bromo-2-chlorotoluene was added before a temperature increases indicated the start of the organometallic reaction. After completion of addition, the reactor was further heated to 65±2° C. (or reflux temperature of THF) and the reaction mixture is maintained at that temperature for 3 h. Then, the reaction mixture was gradually cooled to 13±2° C.

Steps a & b were carried out simultaneously but in separate reactors since neither of the intermediates are stable to storage 3. Synthesis of Tetrabutyl Ammonium Tris(3-Chloro-4-Methyl-Phenyl)hexylborate (Steps c & d)

The solution of step (a) was slowly added to the solution of step (b) at 13±2° C. under constant cooling and stirring. After completion of charging, the reactor temperature was slowly brought to room temperature and stirring was continued for next 4 h (step c). The reaction was then quenched with a solution of 4.8 kg tetrabutyl ammonium bromide in 30 L water at 27±2° C. and stirring continued for additional 30 min. 90 L of ethyl acetate was added in to the reaction mass and the aqueous and organic phases were separated. The aqueous phase was discarded and the organic phase was extracted with water thrice (3*90 L). The organic phase was then concentrated to get a slurry. 150 L methanol were added to the slurry, and it was heated to reflux temperature (65-70° C.) for 1-2 h and then gradually cooled over the period of 6 h to 25±2° C. The reaction mass was cooled to 10±1° C. over a period of 2 h and the recrystallized product was filtered. The product was washed with 5-10 L methanol. The recrystallization process was performed two times and product was dried at 60±2° C. in vaccuo until the desired LOD values (<0.1%) was achieved. The product obtained was a white solid with output of 5.6 kg, yield 45% of theory, purity ~97% and APHA 30.

Example 3

1. Synthesis of Lithium Triisopropyl (Hexyl) Borate (Step a)

180 L dry THF was charged into the reactor and (11 kg) triisopropyl borate was added and degassed with slow stream of nitrogen gas for 15 min. The reactor was cooled to −78±2° C. and 20 kg n-hexyllithium (2.3 M) was transferred slowly into the reactor under stirring. This reaction was continued for two hours at −78° C. After this the reaction mass was allowed to gradually reach temperature of 8±2° C.

2. Grignard Reaction (Step b)

160 L dry THF was charged into the reactor and 4.8 kg magnesium along with 160 g of iodine added. The reactor was heated to 48±2° C. and (40 kg) 4-bromo-2-chlorotoluene along with 80 L dry THF was charged to the dropping funnel. Both the solutions from reactor and dropping funnel were degassed with slow stream of nitrogen gas for 15 min respectively. The degassed solution of 4-bromo-2-chlorotoluene from the dropping funnel was charged slowly into the reactor under stirring. A maximum amount of 4.0 L of the solution of 4-bromo-2-chlorotoluene was added before a temperature increases indicated the start of the organometallic reaction. After completion of addition, the reactor was further heated to 65±2° C. (or reflux temperature of THF) and the reaction mixture is maintained at that temperature for 3 h. Then, the reaction mixture was gradually cooled to 13±2° C.

Steps a & b were carried out simultaneously but in separate reactors since neither of the intermediates are stable to storage 3. Synthesis of Tetrabutyl Ammonium Tris(3-Chloro-4-Methyl-Phenyl)Hexylborate (Steps c & d)

The solution of step a was slowly added to the solution of step b at 13±2° C. under constant stirring. After completion of charging, the reactor temperature was slowly brought to room temperature and stirring was continued for next 4 h (step c). The reaction was then quenched with a solution of 12.8 kg tetrabutyl ammonium bromide in 80 L water at 27±2° C. and stirring continued for additional 30 min. 240 L of ethyl acetate was added in to the reaction mass and the aqueous and organic phases were separated. The aqueous phase was discarded and the organic phase was extracted with water thrice (3*240 L). The organic phase was then concentrated to get a slurry. 400 L methanol were added to the slurry and it was heated to reflux temperature (65-70° C.) for 1-2 h and then gradually cooled over the period of 6 h to 25±2° C. The reaction mixture was then cooled to 10±1° C. over a period of 2 h and the recrystallized product was filtered. The product was washed with 10-15 L methanol. The resulting crude product was dissolved in 52 L ethyl acetate and filtered through 0.2 μm cartridge filter. Ethyl acetate was evaporated and product was precipitated out from the concentrated mass in 60 L methanol. Precipitated mass was cooled to 10° C. (for 30 min) and the product was isolated by filtration. The product was dried at 80±2° C. in vaccuo until the desired LOD values (<0.1%) was achieved. The product obtained was a white solid with output of 18.46 kg, yield 55% of theory, purity ~96% and APHA 40

TABLE 1

|  | Example 1 | Example 2 | Example 3 |
|---|---|---|---|
| Isolated Yield [%] | 50 | 45 | 55 |
| Purity by HPLC method 1 [%] | 95 | 97 | 96 |
| Colour [APHA] | 50 | 30 | 40 |

As presented in table 1, the examples 1, 2, and 3 can be produced according the inventive process containing step a)-d) in excellent yields and purities.

Preparation of Holographic Media

Example Medium 1 (M1)

3.38 g of polyol component 1 were mixed with 2.00 g of acrylate 1, 2.00 g of acrylate 2, 1.50 g of additive 1, 0.10 g of tetrabutyl ammonium tris(3-chloro-4-methyl-phenyl)hexylborate (example 1), 0.018 g of Dye 1, 0.09 g of example 1 and 0.35 g of ethyl acetate at 40° C. to obtain a clear solution. The solution was then cooled down to 30° C., 0.65 g of Desmodur® N3900 (commercial product from Covestro AG, Leverkusen, Germany, hexane diisocyanate-based polyisocyanate, portion on iminooxadiazinedione at least 30%, NCO content: 23.5%) was added before renewed mixing. Finally, 0.01 g of Fomrez UL 28 (urethanization catalyst, commercial product of Momentive Performance Chemicals, Wilton, Conn., USA) was added and again briefly mixed in. The mixed photopolymer formulation was applied on 36 μm thick polyethylene terephthalate film. The coated film was dried for 5.8 minutes at 80° C. and finally covered with a 40 μm polyethylene film. The achieved photopolymer layer thickness was around 14 μm.

The media M2 and M3 were prepared analogously using 0.10 g tetrabutyl ammonium tris(3-chloro-4-methyl-phenyl) hexylborate from example 2 and example 3.

TABLE 2

| Example Medium | Example | Δn |
|---|---|---|
| M1 | 1 | 0.040 |
| M2 | 2 | 0.040 |
| M3 | 3 | 0.039 |

As presented in table 2, holographic media with the examples 1, 2, and 3 produced according the inventive process containing step a)-d) provide holographic media with high index contrast.

The invention claimed is:

1. Process for the production of triaryl-organo borates of the formula $1/m\ A^{m+}[R^1BR_3^3]^-$ (IX) obtainable or obtained by reacting a boronic ester of formula $B(OR^2)_3$ (I) with an organolithium- or Grignard-reagent of formula $R^1$-E (II) in a solvent or solvent mixture S1, adding a previously formed organometallic reagent of the formula $R^3$-M-X (V) in a solvent or solvent mixture S2, further adding a salt of the formula $1/m\ A^{m+}\ Y^-$ (VIII) and isolating the precipitated triaryl-alkyl borate product of formula $1/m\ A^{m+}[R^1BR_3^3]^-$ (IX), wherein the triaryl-alkyl borate of $1/m\ A^{m+}[R^1BR_3^3]^-$ (IX) comprises less than 10.000 ppm of tetra aryl borate $A^{m+}[BR_4^3]^-$, in which A stands for a substituted organic cation with the charge m on the basis of nitrogen, phosphorus, oxygen, sulfur and/or iodine, B stands for boron E stands for lithium or magnesium-monohalide, M stands for a metal selected from magnesium, calcium, aluminum, tin, zinc or cadmium, X stands for chlorine, bromine or iodine, Y stands for halide, alkoxide, or sulfide, $R^1$ stands for a $C_1$- to $C_{22}$-alkyl-, $C_3$- to $C_{22}$-alkenyl-, $C_3$- to $C_{22}$-alkynyl-, $C_5$- to $C_7$-cycloalkyl- or $C_7$- to $C_{15}$-aralkyl-residue, which can be optionally substituted by oxygen or nitrogen or halogen, $R^2$ stands for an optionally branched $C_1$- to $C_{22}$-alkyl-residue or an optionally alkyl-substituted $C_3$- to $C_7$-cycloalkyl-residue or an optionally aryl- or heteroaryl substituted $C_2$- to $C_{22}$-alkyl-residue or $R^2$ may form a 2-8-membered bicyclic ring optionally substituted by alkyl residues and/or by oxygen atoms or $R^2$ may form a 4-14-membered tricyclic ring an optionally substituted by alkyl residues and/or by oxygen atoms, $R^3$ stands for a $C_6$- to $C_{14}$-aryl residue optionally substituted by at least one residue selected from halogen, $C_1$-to $C_4$-alkyl, trifluoromethyl, $C_1$- to $C_4$-alkoxy, trifluoromethoxy, phenyl and/or phenoxy, m stands for 1, 2 or 3, S1 and S2 independently from one another stand for an aprotic organic solvent or a mixture of aprotic organic solvents.

2. The process according to claim 1 comprising the steps of i) reacting boronic ester of formula $B(OR^2)_3$ (I) in a solvent or solvent mixture S1 at a temperature or temperature range T1 with an organolithium- or Grignard-reagent of formula $R^1$-E (II) to yield the salt of formula $[R^1B(OR^2)_3]^-E^+$ (III), ii) reacting an organic halogen compound of formula $R^3$-X (IV) in a solvent or solvent mixture S2 at a temperature or temperature range T2 with a metal M to yield an organometallic reagent of formula $R^3$-M-X (V), iii) reacting the compounds (III) and (V) in a combined solvent or solvent mixture S1 and S2 at a temperature or temperature range T3 to yield the salts of formula $[R^1BR_3^3]^-E^+$ (VI) and of formula $R^2O$-M-X (VII), iv) adding the salt of formula $1/m\ A^{m+}\ Y^-$ (VIII) and water and v) isolating the precipitated product of formula $1/m\ A^{m+}[R^1BR_3^3]^-$ (IX)

whereby

T1 stands for a temperature of −110° C. to −50° C.,

T2 stands for a temperature of −20° C. to 100° C., and

T3 stands for a temperature of 0° C. to 100° C.

3. Process according to claim 1, characterized in that $R^1$ stands for an $C_2$- to $C_{18}$-alkyl-, $C_3$- to $C_{18}$-alkenyl-, $C_3$- to $C_{18}$-alkynyl-, $C_5$- to $C_6$-cycloalkyl- or $C_7$- to $C_{13}$-aralkyl residue optionally substituted by oxygen and/or halogen.

4. Process according to claim 1, characterized in that $R^2$ stands for a branched $C_2$- to $C_{18}$-alkyl-residue or $R^2$ forms a 2-6-membered bicyclic ring optionally substituted by alkyl residues and/or by oxygen atoms or $R^2$ may form a 4-10-membered tricyclic ring optionally substituted by alkyl residues and/or by oxygen atoms.

5. Process according to claim 1, characterized in that $R^3$ stands for a $C_6$- to $C_{10}$-aryl residue that may be optionally substituted by at least one of the residues selected from halogen, $C_1$-to $C_4$-alkyl, trifluoromethyl, $C_1$- to $C_4$-alkoxy, trifluormethoxy, phenyl and/or phenoxy.

6. Process according to claim 1, characterized in that S1 and S2 independently from one another stand for alkanes, alkenes, benzene and aromatics with aliphatic and/or aromatic substituents, carboxylic acid esters, ethers or mixtures thereof.

7. Process according to claim 1, characterized in that M stands for magnesium, calcium or aluminum.

\* \* \* \* \*